United States Patent
Wu et al.

(10) Patent No.: US 10,032,910 B2
(45) Date of Patent: Jul. 24, 2018

(54) FINFET DEVICES HAVING ASYMMETRICAL EPITAXIALLY-GROWN SOURCE AND DRAIN REGIONS AND METHODS OF FORMING THE SAME

(71) Applicant: GLOBALFOUNDRIES, INC., Grand Cayman (KY)

(72) Inventors: Xusheng Wu, Ballston Lake, NY (US); Changyong Xiao, Mechanicville, NY (US); Min-hwa Chi, Malta, NY (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 112 days.

(21) Appl. No.: 14/695,411

(22) Filed: Apr. 24, 2015

(65) Prior Publication Data

US 2016/0315172 A1    Oct. 27, 2016

(51) Int. Cl.
  *H01L 29/78*       (2006.01)
  *H01L 29/08*       (2006.01)
  *H01L 27/088*      (2006.01)
  *H01L 29/66*       (2006.01)
  *H01L 21/3115*     (2006.01)
  *H01L 29/165*      (2006.01)

(52) U.S. Cl.
  CPC .... *H01L 29/7848* (2013.01); *H01L 21/31155* (2013.01); *H01L 27/0886* (2013.01); *H01L 29/0847* (2013.01); *H01L 29/6656* (2013.01); *H01L 29/66795* (2013.01); *H01L 29/165* (2013.01)

(58) Field of Classification Search
  CPC ..... H01L 21/823431; H01L 21/823821; H01L 21/845; H01L 27/0886; H01L 27/0924; H01L 27/10826; H01L 27/10879; H01L 27/1211; H01L 29/41791; H01L 29/66795; H01L 29/7831; H01L 29/785; H01L 2924/13067
  See application file for complete search history.

(56) References Cited

U.S. PATENT DOCUMENTS

| | | | |
|---|---|---|---|
| 8,263,451 B2 * | 9/2012 | Su | H01L 29/785 257/190 |
| 2013/0214357 A1 * | 8/2013 | Chang | H01L 29/66545 257/347 |

(Continued)

OTHER PUBLICATIONS

Liao et al., WO 2015/147842, filed Mar. 27, 2014.*

*Primary Examiner* — Michael Lebentritt
*Assistant Examiner* — Suberr Chi
(74) *Attorney, Agent, or Firm* — Lorenz & Kopf, LLP

(57) ABSTRACT

Fin field-effect transistor (FinFET) devices and methods of forming the same are provided herein. In an embodiment, a FinFET device includes a semiconductor substrate having a plurality of fins disposed in parallel relationship. A first insulator layer overlies the semiconductor substrate, with the fins extending through and protruding beyond the first insulator layer to provide exposed fin portions. A gate electrode structure overlies the exposed fin portions and is electrically insulated from the fins by a gate insulating layer. Epitaxially-grown source regions and drain regions are disposed adjacent to the gate electrode structure. The epitaxially-grown source regions and drain regions have an asymmetric profile along a lateral direction perpendicular to a length of the fins.

10 Claims, 5 Drawing Sheets

(56) References Cited

U.S. PATENT DOCUMENTS

| | | | |
|---|---|---|---|
| 2014/0170827 A1* | 6/2014 | Zhang | H01L 29/66356 438/305 |
| 2014/0291761 A1* | 10/2014 | Cheng | H01L 29/785 257/347 |
| 2015/0069526 A1* | 3/2015 | Basker | H01L 29/7856 257/401 |
| 2015/0364593 A1* | 12/2015 | Jangjian | H01L 29/785 257/401 |
| 2016/0155845 A1* | 6/2016 | Breil | H01L 29/785 257/347 |
| 2017/0054003 A1* | 2/2017 | Liao | H01L 29/66795 |

\* cited by examiner

FINFET DEVICES HAVING ASYMMETRICAL EPITAXIALLY-GROWN SOURCE AND DRAIN REGIONS AND METHODS OF FORMING THE SAME

TECHNICAL FIELD

The technical field generally relates to fin field-effect transistor (FinFET) devices and methods of forming the same, and more particularly relates to FinFET devices having an epitaxially-grown source and drain regions and methods of forming the FinFET devices having the epitaxially-grown source and drain regions.

BACKGROUND

Transistors such as metal oxide semiconductor field effect transistors (MOSFETs) or simply field effect transistors (FETs) are the core building blocks of the vast majority of semiconductor integrated circuits (ICs). A FET includes source and drain regions between which a current can flow through a channel under the influence of a bias applied to a gate electrode that overlies the channel. Some semiconductor ICs, such as high performance microprocessors, can include millions of FETs. For such ICs, decreasing transistor size and thus increasing transistor density has traditionally been a high priority in the semiconductor manufacturing industry. Transistor performance, however, must be improved as the transistor size decreases.

A Fin field-effect transistor (FinFET) is a type of transistor that lends itself to the dual goals of reducing transistor size while increasing transistor performance. The FinFET is a three dimensional transistor formed in a thin fin that extends upwardly from a semiconductor substrate. Transistor performance, often measured by its transconductance, is proportional to the width of the transistor channel. In a FinFET the transistor channel is formed along the vertical sidewalls of the fin or on both vertical sidewalls and the top horizontal plane of the fin, so a wide channel, and hence high performance, can be achieved without substantially increasing the area of the substrate surface required by the transistor.

FinFETs provide a promising candidate for small line width technology (e.g., approximately 22 nm and below) because of their excellent short channel effect control and scalability. Epitaxially-grown source and drain regions are often formed for the FinFETs by replacing portions of the fin with epitaxially-grown material. The epitaxially-grown source and drain regions may be employed to provide either compressive or tensile strain (depending upon whether a P-type FinFET or N-type FinFET is to be formed) within a channel of the FinFETs. The channel is the region of the fin disposed under a gate electrode structure and between the source region and the drain region. Compressive strain and tensile strain serve to increase hole mobility or electron mobility, respectively, within the channel. For example, the epitaxially-grown source and drain regions may include silicon germanium (SiGe) to provide compressive strain within the channel, thereby resulting in enhanced hole mobility that is desirable for P-type FinFETs. As another example, the epitaxially-grown source and drain regions may include silicon carbon (SiC) or/and silicon carbon phosphorous (SiC:P) to provide tensile strain within the channel, thereby resulting in enhanced electron mobility that is desirable for N-type FinFETs.

To form the epitaxially-grown source and drain regions, portions of the fin adjacent to the gate electrode structure are etched to form trenches, followed by epitaxially growing the appropriate material (depending upon whether P-type FinFETs or N-type FinFETs are to be formed) in the trenches. To selectively expose portions of the fin where trenches are to be formed, a hard mask is patterned to define gaps where the trenches are to be formed. Sidewall spacers formed from material of the hardmask remain disposed adjacent to the fin after patterning and after formation of the trenches. Epitaxial growth generally propagates both vertically and laterally, with the epitaxially-grown material growing over the sidewall spacers and toward epitaxially-grown source and drain regions of adjacent fins, often resulting in merger of the epitaxially-grown source and drain regions of adjacent fins. Merger of the epitaxially-grown source and drain regions of adjacent fins will result in failure for single fin devices (where multiple adjacent fins each include separate transistors). Avoiding merger of epitaxially-grown source and drain regions of adjacent fins becomes more difficult as line width technology continues to scale down, with distances between fins becoming smaller and smaller. Further, efforts to minimize a profile of the epitaxially-grown source and drain regions results in less available surface area of the epitaxially-grown source and drain regions for formation of silicide, thereby possibly compromising effective electrical connection to the epitaxially-grown source and drain regions especially as line width technology continues to scale down.

Accordingly, it is desirable to provide FinFET devices and methods of forming such FinFET devices that avoid merger between epitaxially-grown source and drain regions of adjacent fins while also maximizing available surface area of the epitaxially-grown source and drain regions for formation of silicide, even as line width technology continues to scale down. Furthermore, other desirable features and characteristics of the present invention will become apparent from the subsequent detailed description of the invention and the appended claims, taken in conjunction with the accompanying drawings and this background of the invention.

BRIEF SUMMARY

Fin field-effect transistor (FinFET) devices and methods of forming the same are provided herein. In an embodiment, a FinFET device includes a semiconductor substrate having a plurality of fins disposed in parallel relationship. A first insulator layer overlies the semiconductor substrate, with the fins extending through and protruding beyond the first insulator layer to provide exposed fin portions. A gate electrode structure overlies the exposed fin portions and is electrically insulated from the fins by a gate insulating layer. Epitaxially-grown source regions and drain regions are disposed adjacent to the gate electrode structure. The epitaxially-grown source regions and drain regions have an asymmetric profile along a lateral direction perpendicular to a length of the fins.

In another embodiment, a fin field-effect transistor device includes a semiconductor substrate having a plurality of fins disposed in parallel relationship. A first insulator layer overlies the semiconductor substrate, with the fins extending through and protruding beyond the first insulator layer to provide exposed fin portions. A gate electrode structure overlies the exposed fin portions and is electrically insulated from the fins by a gate insulating layer. Epitaxially-grown source regions and drain regions are disposed adjacent to the gate electrode structure. A first sidewall spacer is disposed adjacent to a first side of the fins and directly over the first insulator layer. Optionally, a second sidewall spacer is disposed adjacent to a second side of the fins and over the first insulator layer, wherein when present the second sidewall spacer is smaller than the first sidewall spacer. Portions of the epitaxially-grown source regions and drain regions are further disposed overlying a top of the first sidewall spacer and a top of the second sidewall spacer when present.

In another embodiment, a method of forming a FinFET device includes providing a semiconductor substrate having a plurality of fins with a first insulator layer overlying the semiconductor substrate, with the fins extending through and protruding beyond the first insulator layer to provide exposed fin portions, and with a gate electrode structure overlying the exposed fin portions and electrically insulated from the fins by a gate insulating layer. A first intermediate sidewall spacer is formed adjacent to the first side of the fins and over the first insulator layer and a second intermediate sidewall spacer adjacent to the second side of the fins and over the first insulator layer. The second intermediate sidewall spacer is asymmetrically etched as compared to the first intermediate sidewall spacer to produce a first sidewall spacer and optionally a second sidewall spacer adjacent to a source region and a drain region in the fins, wherein when present the second sidewall spacer is smaller than the first sidewall spacer. Portions of the fins adjacent to the gate electrode structure are etched with a fin etchant to form trenches. Semiconductor material is epitaxially grown in the trenches to form epitaxially-grown source regions and drain regions, wherein portions of the epitaxially-grown source regions and drain regions are further disposed overlying a top of the first sidewall spacer and a top of the second sidewall spacer when present.

BRIEF DESCRIPTION OF THE DRAWINGS

The various embodiments will hereinafter be described in conjunction with the following drawing figures, wherein like numerals denote like elements, and wherein.

DETAILED DESCRIPTION

The following detailed description is merely exemplary in nature and is not intended to limit the fin field-effect transistor (FinFET) devices and methods of forming the FinFET devices as contemplated herein. Furthermore, there is no intention to be bound by any theory presented in the preceding background or the following detailed description.

Embodiments of the present disclosure are generally directed to FinFET devices and methods for forming the same. For the sake of brevity, conventional techniques related to FinFET device fabrication may not be described in detail herein. Moreover, the various tasks and process steps described herein may be incorporated into a more comprehensive procedure or process having additional steps or functionality not described in detail herein. In particular, various steps in the manufacture of semiconductor-based transistors are well-known and so, in the interest of brevity, many conventional steps will only be mentioned briefly herein or will be omitted entirely without providing the well-known process details.

Fin field-effect transistor (FinFET) devices and methods of forming the FinFET devices that avoid merger between epitaxially-grown source regions and drain regions of adjacent fins are provided herein. In particular, merger between an epitaxially-grown source region on one fin and an epitaxially-grown source region on an immediately adjacent fin is avoided, and merger between an epitaxially-grown drain region on one fin and an epitaxially-grown drain region on an immediately adjacent fin is also avoided. Merger between the epitaxially-grown source regions and drain regions of adjacent fins often occurs due to the manner in which epitaxial growth of the source regions and drain region propagates, with growth occurring both vertically and laterally. The merger between the epitaxially-grown source regions and drain regions of adjacent fins is avoided by providing epitaxially-grown source regions and drain regions having an asymmetric profile along a lateral direction perpendicular to a length of the fins. By "asymmetric profile", it is meant that the epitaxially-grown source regions and drain regions laterally protrude from the fin further on a first side of the fin than on a second side of the fin that is opposite to the first side. The asymmetric profile of the epitaxially-grown source regions and drain regions effectively increases a distance between epitaxially-grown source regions and drain regions on adjacent fins while also maximizing available surface area of the epitaxially-grown source regions and drain regions for formation of silicide, even as line width technology continues to scale down.

Figure 1:
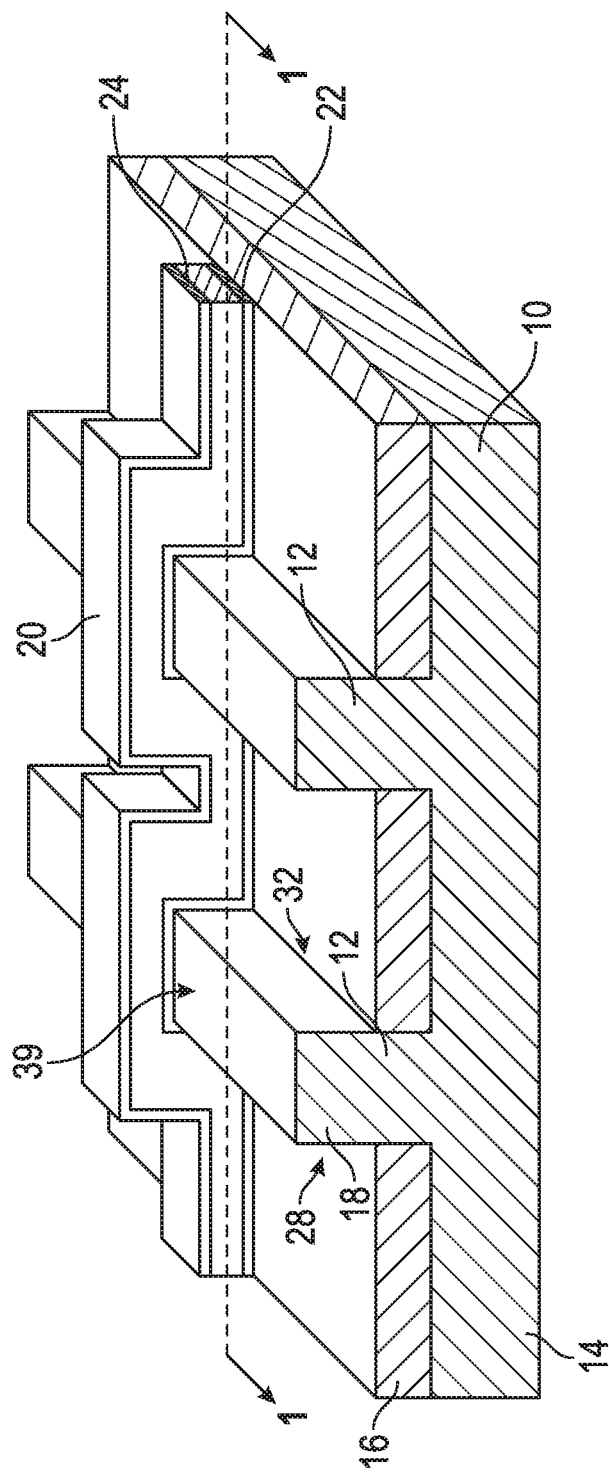
FIG. 1 is a perspective view of a portion of a semiconductor substrate including a plurality of fins and a gate electrode structure overlying the fins.

Referring to FIG. 1, in accordance with an exemplary embodiment of a method for forming a FinFET device, a semiconductor substrate 10 is provided that has a plurality of fins 12 formed therein or thereon, with the fins 12 disposed in parallel relationship. Although only two fins 12 are shown, it is to be appreciated that the semiconductor substrate 10 may include numerous additional fins 12 in accordance with conventional FinFET technology. Without intending to be limiting, the fins 12 may have a width on the nanometer scale, such as from about 5 to about 20 nm, although the FinFET devices and methods described herein are not limited to any particular dimensional constraints. As used herein, the term "semiconductor substrate" will be used to encompass semiconductor materials that are conventionally used in the semiconductor industry. "Semiconductor materials" include monocrystalline silicon materials, such as relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, and the like. In the embodiment shown in FIG. 1, the semiconductor substrate 10 is a bulk silicon wafer with the fins 12 are formed in the bulk silicon wafer. However, it is to be appreciated that in other embodiments and although not shown in the Figures, the semiconductor substrate 10 may include a silicon-containing material that is disposed on an insulating material, commonly known as a silicon-on-insulator (SOI) structure that, in turn, may be supported by a support substrate.

For illustrative purposes, only a portion 14 of the semiconductor substrate 10 is shown in FIG. 1. In embodiments, the fins 12 are doped with a dopant chosen from P-type dopants or N-type dopants in accordance with conventional well formation. For example, in an embodiment, the portion 14 of the semiconductor substrate 10 and the fins 12 are doped with a P-type dopant such as, but not limited to, boron, aluminum, gallium, indium, $BF_2$, and combinations thereof in anticipation of forming an N-type metal oxide semiconductor (NMOS) FinFET. However, it is to be appreciated that, although not shown, other portions of the semiconductor substrate 10 may be doped with an N-type dopant such as, but not limited to, phosphorus, arsenic, antimony, and combinations thereof in anticipation of forming a P-type metal oxide semiconductor (PMOS) FinFET. In this regard, the methods described herein are suitable for forming either NMOS FinFETs or PMOS FinFETs, depending upon the particular materials that are employed for forming features of the respective FinFETs. If the FinFET device being fabricated is a complimentary MOS integrated circuit (CMOS IC), there will be at least one portion of the semiconductor substrate 10 and fins 12 that is doped with N-type dopant and at least one portion of the semiconductor substrate 10 and fins 12 doped with P-type dopant. The portions of the semiconductor substrate 10 can be doped, for example, by ion implantation prior to or after forming the fins 12 in or on the semiconductor substrate 10, with the fins 12 including the dopant. Multiple ion implantation steps may be used to achieve a desired dopant concentration and profile.

As shown in FIG. 1, a gate electrode structure 20 is disposed over the fins 12. For example, in an embodiment, a first insulator layer 16 overlies the semiconductor substrate 10 and has a thickness that is less than a height of the fins 12 such that the fins 12 extend through and protrude beyond the first insulator layer 16 to provide exposed fin portions 18. As referred to herein, the terms "overlie" or "overlies" are used to encompass both "over" and "on", with features that "overlie" other features being disposed over the other features or directly upon the other features. The first insulator layer 16 is not particularly limited and may include an oxide such as, for example, silicon dioxide. The gate electrode structure 20 overlies the fins 12 and, more specifically, overlies the exposed fin portions 18. The gate electrode structure 20 is electrically insulated from the fins 12 by a gate insulating layer 22. In embodiments and as shown in FIG. 1, the gate electrode structure 20 wraps around the exposed fin portions 18, on three sides thereof, in accordance with conventional FinFET technology. The gate electrode structure 20 may be formed over the fins 12 through conventional techniques, such as gate-first or gate-last, poly-silicon/SiON or Hi-K/metal-gate techniques. For example, in embodiments, the gate electrode structure 20 is a dummy gate structure and formation of the FinFET device includes eventually replacing the dummy gate structure after formation of epitaxially-grown source regions and drain regions, as set forth in further detail below. In an embodiment and as shown in FIG. 1, a nitride cap 24 may be disposed overlying the gate electrode structure 20 to facilitate formation of the gate electrode structure 20 and to provide protection to the gate electrode structure 20 during formation of the FinFET device. The nitride cap 24 may be formed from any nitride such as, for example, silicon nitride.

FIGS. 2-6 illustrate the portion 14 of the semiconductor substrate 10 of FIG. 1 in cross-section taken along line 1-1 for purposes of illustrating an exemplary method of forming the FinFET device. In accordance with an exemplary embodiment and referring to FIGS. 2 and 3, a first intermediate sidewall spacer 26 is formed adjacent to a first side 28 of the fins 12 and over the first insulator layer 16 and a second intermediate sidewall spacer 30 is also formed adjacent to a second side 32 of the fins 12 and over the first insulator layer 16. As alluded to above, the FinFET devices may include both N-type FinFETs and P-type FinFETs. The first intermediate sidewall spacer 26 and the second intermediate sidewall spacer 30 may be formed during formation of conventional gate spacers (not shown) for the N-type FinFETs and P-type FinFETs, and intermediate sidewall spacers may be formed at different stages and locations within the FinFET devices during formation of the FinFET devices.

Figure 2:
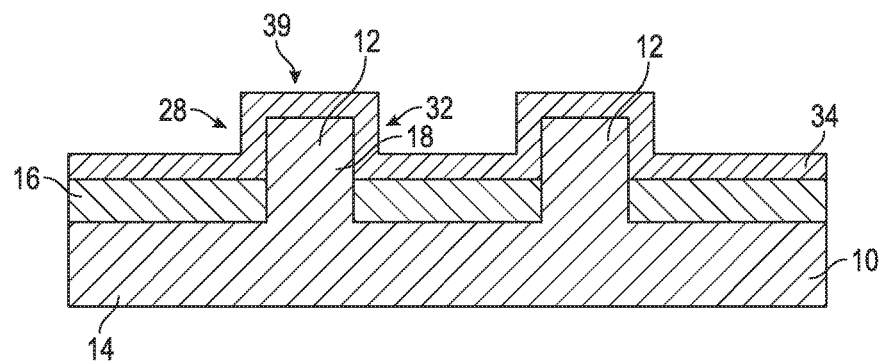
FIGS. 2-6 are cross-sectional side views of the semiconductor substrate of FIG. 1, taken along line 1-1 of FIG. 1, illustrating an exemplary method for forming a FinFET device.

In embodiments and referring to FIG. 2, a hardmask layer 34 is formed by blanket depositing hardmask material over the fins 12 and the first insulator layer 16 as well as over the gate electrode structure (not shown in FIG. 2). Suitable hardmask materials for the hardmask layer 34 include materials that have a different etch rate as compared to the fins 12 and the first insulator layer 16. For example, in embodiments, the hardmask layer 34 includes a silicon-containing dielectric material chosen from silicon nitride, silicon oxide, silicon carbide, silicon oxycarbonitride, silicon carboxynitride, and the like. Additionally, it is to be appreciated that stacked layers formed from the aforementioned materials may be deposited to form the hardmask layer 34.

Figure 3:
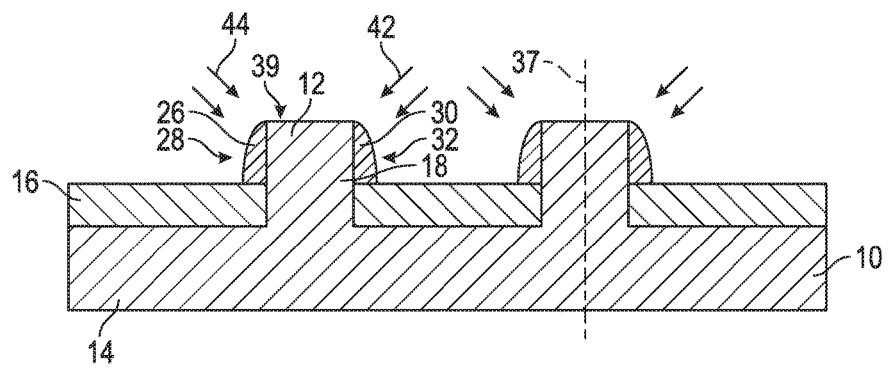

In embodiments, the hardmask layer 34 is patterned to form the intermediate sidewall spacers 26, 30 (as shown in FIG. 3) during patterning of gate spacers for P-type FinFETs or during patterning of gate spacers for P-type FinFETs to form the intermediate sidewall spacers 26, 30. Unlike patterning of the gate spacers (not shown), which are formed on the fins 12 and along sidewalls of the gate electrode structure, the first intermediate sidewall spacer 26 and the second intermediate sidewall spacer 30 as described herein are formed adjacent to the first side 28 of the fins 12 and the second side 32 of the fins 12, respectively, and directly over the first insulator layer 16. As referred to herein, the first intermediate sidewall spacer 26 and the second intermediate sidewall spacer 30 are formed during the same stage from the same hardmask layer 34. The first intermediate sidewall spacer 26 and the second intermediate sidewall spacer 30 may be concurrently formed with the gate spacers by appropriately masking the hardmask layer 34 and anisotropically etching the hardmask layer 34 to form the intermediate sidewall spacers 26, 30 at the same time as formation of the gate spacers. For example, reactive ion etching (RIE) may be employed using sulfur fluoride ($SF_6$) to anisotropically etch the hardmask layer 34 that includes the silicon nitride. As another example, a wet etch may be employed using a dilute solution of hydrofluoric acid (DHF) to anisotropically etch the hardmask layer 34 that includes the silicon oxide, and the DHF may include a buffer such as ammonium fluoride. Other conventional anisotropic etching techniques may be employed beyond those described above and based upon the particular material of the hardmask layer 34.

In embodiments, etching of the hardmask layer 34 to form the intermediate sidewall spacers 26, 30 may proceed until exposed portions of the hardmask layer 34 are substantially removed from horizontal surfaces, thereby exposing a top surface of the fins 12 and horizontal surfaces of the first insulator layer 16 and resulting in the first intermediate sidewall spacer 26 and the second intermediate sidewall spacer 30 as shown in FIG. 3.

Figure 4:
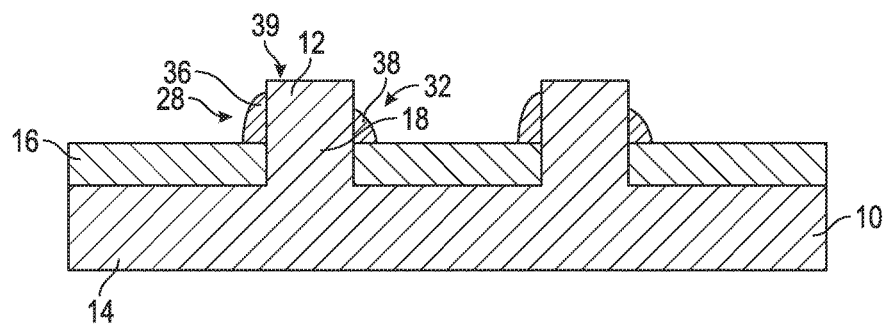

Referring to FIGS. 3 and 4, the second intermediate sidewall spacer 30 is asymmetrically etched as compared to the first intermediate sidewall spacer 26 to produce a first sidewall spacer 36 and optionally a second sidewall spacer 38 adjacent to a source region 39 and a drain region in the fins 12. Because FIGS. 3 and 4 are cross-sectional views, only the source region 39 is shown, although it is to be appreciated that the first sidewall spacer 36 and the second sidewall spacer 38 are situated adjacent the drain region in a similar configuration to that shown for the source region 39 in FIGS. 3 and 4. As referred to herein, "asymmetrically etching" the second intermediate sidewall spacer 30 as compared to the first intermediate sidewall spacer 26 encompasses any technique whereby the second intermediate sidewall spacer 30 is etched at a faster rate as compared to the first intermediate sidewall spacer 26, and further encompasses any technique whereby the second intermediate sidewall spacer 30 is selectively removed while leaving the first intermediate sidewall spacer 26 in place to form the first sidewall spacer 36. In embodiments and as shown in FIG. 4, the second sidewall spacer 38 remains after asymmetric etching, although it is to be appreciated that in other embodiments and as described in further detail below, the second sidewall spacer is completely removed and is absent after asymmetric etching with only the first sidewall spacer 36 remaining.

In embodiments, the second intermediate sidewall spacer 30 is asymmetrically etched as compared to the first intermediate sidewall spacer 26 by implanting ions 42, 44 that have an impact on etch sensitivity into the first intermediate sidewall spacer 26 and/or the second intermediate sidewall spacer 30. In particular, ions may be implanted that either increase or decrease sensitivity of the intermediate sidewall spacers 26, 30 to particular etchants, and the ions may be implanted in a tilted direction to expose one of the first intermediate sidewall spacer 26 or the second intermediate sidewall spacer 30 to more of the particular ion. In an embodiment, the second intermediate sidewall spacer 30 is implanted with a higher content of a first etch-impacting ion 42 as compared to the content of the first etch-impacting ion 42 implanted into the first intermediate sidewall spacer 26, with the first etch-impacting ion 42 increasing an etch rate of intermediate sidewall spacers 26, 30 in the first sidewall etchant. Implanting the second intermediate sidewall spacer 30 with the higher content of the first etch-impacting ion 42 may be accomplished by implanting the first etch-impacting ion 42 in a tilted direction 37, relative to a vertical axis through the fin 12 and substrate 10, with implantation directed more toward the second intermediate sidewall spacer 30 than the first intermediate sidewall spacer 26 and with the first intermediate sidewall spacer 26 at least partially shielded from ion implantation by the fins 12. Thus, etching of the second intermediate sidewall spacer 30 will occur at a faster rate in the particular first sidewall etchant as compared to an etch rate of the first intermediate sidewall spacer 26 due to implantation in the tilted direction with the second intermediate sidewall spacer 30 receiving a higher amount of the first etch-impacting ion 42 than the first intermediate sidewall spacer 26. It is to be appreciated that top portions of the first intermediate sidewall spacer 26 may have greater exposure to the tilted implantation of the first etch-impacting ion 42 and, thus, may etch at a faster rate than lower portions of the first intermediate sidewall spacer 26. However, on the whole, the first intermediate sidewall spacer 26 will have a lower content of the first etch-impacting ion 42 than the second intermediate sidewall spacer 30, thus resulting in different etch impact on the respective intermediate sidewall spacers 26, 30.

Depending upon the type of material used for the hardmask layer 34, the following first etch-impacting ions 42 may be implanted to increase sensitivity of the hardmask layer 34 to particular first sidewall etchants: nitrogen ($N_2$), fluorine, or oxygen ($O_2$). Specific examples of combinations of materials for the hardmask layer 34 and first etch-impacting ions 42 that increase sensitivity of the hardmask layer 34 to particular etchants are as follows: for silicon nitride, $N_2$ may be employed as the first etch-impacting ion 42; for silicon oxide, $O_2$ may be employed as the first etch-impacting ion 42.

In another embodiment, the second intermediate sidewall spacer 30 is asymmetrically etched as compared to the first intermediate sidewall spacer 26 by asymmetrically implanting the first intermediate sidewall spacer 26 with a higher content of a second etch-impacting ion 44 as compared to the content of the second etch-impacting ion 44 implanted into the second intermediate sidewall spacer 30, with the second etch-impacting ion 44 decreasing an etch rate of intermediate sidewall spacers 26, 30 in the first sidewall etchant. As with the techniques described above for implanting the second intermediate sidewall spacer 30 with the higher content of the first etch-impacting ion 42, the first intermediate sidewall spacer 26 may be implanted with the higher content of the second etch-impacting ion 44 by implanting the second etch-impacting ion 44 in a tilted direction with implantation directed more toward the first intermediate sidewall spacer 26 than the second intermediate sidewall spacer 30 and with the second intermediate sidewall spacer 30 at least partially shielded from ion implantation by the fins 12. Thus, etching of the first intermediate sidewall spacer 26 will occur at a slower rate in the particular first sidewall etchant as compared to an etch rate of the second intermediate sidewall spacer 30 due to implantation in the tilted direction with the first intermediate sidewall spacer 26 receiving a higher amount of the second etch-impacting ion 44 than the second intermediate sidewall spacer 30. It is to be appreciated that top portions of the second intermediate sidewall spacer 30 may have greater exposure to the tilted implantation of the second etch-impacting ion 44 and, thus, may etch at a slower rate than lower portions of the second intermediate sidewall spacer 30. However, on the whole, the second intermediate sidewall spacer 30 will have a lower content of the second etch-impacting ion 44 than the first intermediate sidewall spacer 26, thus resulting in different etch impact on the respective intermediate sidewall spacers 26, 30.

Depending upon the type of material used for the hardmask layer 34, the following second etch-impacting ions 44 may be implanted to decrease sensitivity of the hardmask layer 34 to particular first sidewall etchants: hydrogen, carbon, or nitrogen ($N_2$). Specific examples of combinations of materials for the hardmask layer 34 and second etch-impacting ions 44 that decrease sensitivity of the hardmask layer 34 to particular etchants are as follows: for silicon nitride, hydrogen may be employed as the first etch-impacting ion 42; for silicon oxide, $N_2$ may be employed as the first etch-impacting ion 42.

In embodiments, a combination of different types of ions may be implanted into the respective first intermediate sidewall spacer 26 and the second intermediate sidewall spacer 30 to both increase the etch rate of the second intermediate sidewall spacer 30 in the first sidewall etchant and decrease the etch rate of the first intermediate sidewall spacer 26 in the first sidewall etchant. For example, as shown in FIG. 3, the first etch-impacting ion 42 may be implanted in a tilted direction with implantation directed more toward the second intermediate sidewall spacer 30 than the first intermediate sidewall spacer 26, and the second etch-impacting ion 44 may be implanted in another tilted direction with implantation directed more toward the first intermediate sidewall spacer 26 than the second intermediate sidewall spacer 30.

Following ion implantation and referring to FIG. 4, the intermediate sidewall spacers 26, 30 are again etched using the same or different etching techniques as described above for etching the hardmask layer 34 to form the intermediate sidewall spacers 26, 30. The chosen etch technique for etching the intermediate sidewall spacers 26, 30 is dependent upon the particular etch-impacting ions 42, 44 that are employed so as to asymmetrically etch the second intermediate sidewall spacer 30 as compared to the first intermediate sidewall spacer 26, thereby producing at least the first sidewall spacer 36 and optionally the second sidewall spacer 38 that, when present, has a smaller profile than the first sidewall spacer 36.

Figure 5:
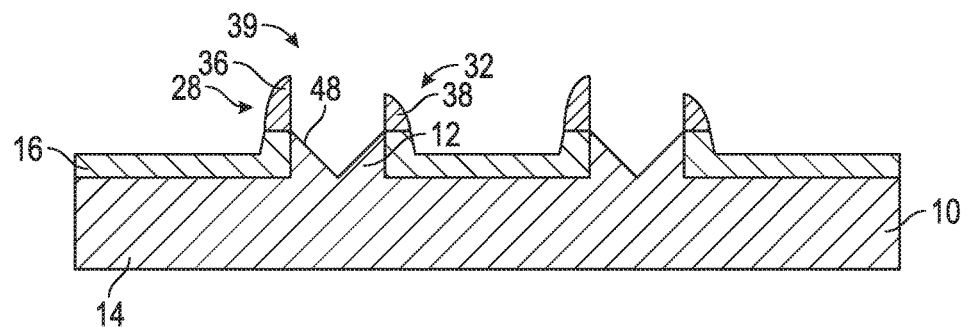
Figure 6:
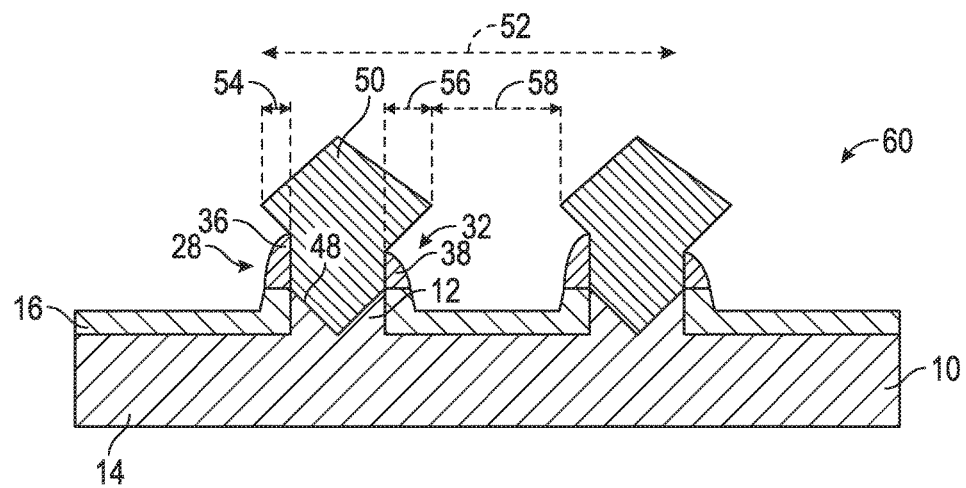

Referring to FIGS. 5 and 6, following formation of the first sidewall spacer 36 and, optionally, the second sidewall spacer 38, epitaxially-grown source regions 50 and drain regions (not shown) are formed. In embodiments and although not shown, halo and/or extension regions for the source regions and drain regions may first be formed through conventional ion implantation techniques using appropriate ions for the particular type of transistors (i.e., P-type or N-type) that are to be formed. After forming the halo and/or extension regions, portions of the fins 12 that are adjacent to the gate electrode structure are etched with a fin etchant to form trenches 48 in anticipation of forming epitaxially-grown source regions 50 and drain regions in the trenches 48. A middle of the trenches 48 may be etched deeper than edges of the trenches 48, resulting in the profile of the trenches 48 shown in FIG. 5, which is a typical profile resulting from anisotropic etching. Appropriate fin etchants may be chosen based upon the composition of the fins 12 and the composition of the sidewall spacers 36, 38. For example, in an embodiment, a reactive ion etch with hydrofluoric acid may be employed to selectively etch silicon in the fins 12 over sidewall spacers 36, 38 that include silicon nitride. In embodiments, the particular etchant used may also be selective to the material of the first insulator layer 16, resulting in recessing of the first insulator layer 16 as shown in FIG. 5. However, selectivity of the fin etchant to the material of the first insulator layer 16 is not required, and fin etchants may alternatively be chosen that exhibit insubstantial etching of the material in the first insulator layer 16.

Figure 7:
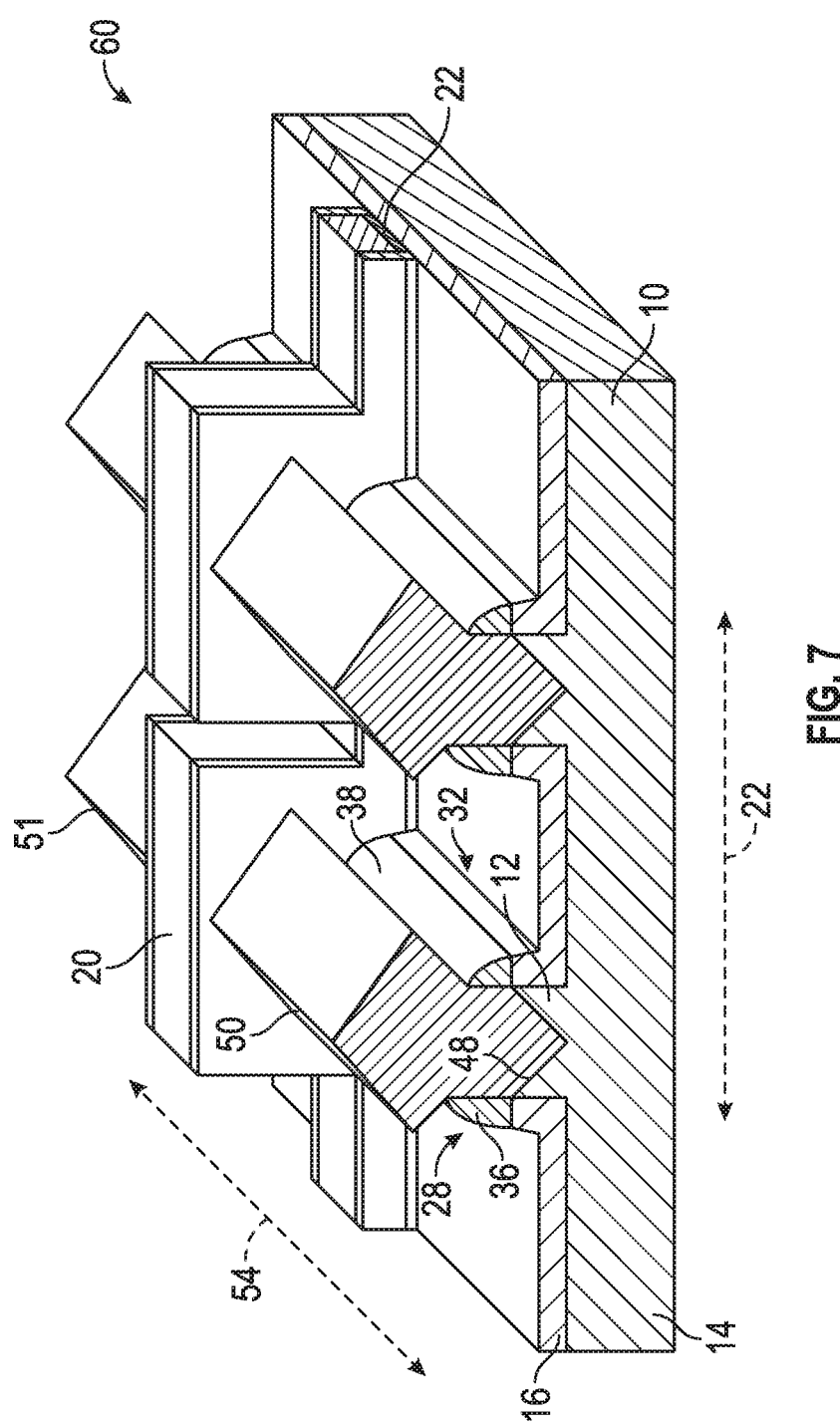
FIG. 7 is a perspective view of the FinFET device formed in accordance with the method shown in FIGS. 2-6.

In embodiments and referring to FIGS. 6 and 7, semiconductor material is epitaxially grown in the trenches 48 to form epitaxially-grown source regions 50 and epitaxially-grown drain regions 51. Epitaxial growth generally propagates both vertically and laterally from crystalline semiconductor material of the semiconductor substrate 10 that is exposed in the trenches 48. The first insulator layer 16 masks the portions of the semiconductor substrate 10 outside of the trenches 48, and the sidewall spacers 36, 38 restrict lateral epitaxial growth of the semiconductor material. Epitaxial growth of the semiconductor material may persist beyond filling of the trenches 48 to provide sufficient surface area for later silicide formation on surfaces of the epitaxially-grown source regions 50 and drain regions 51. Due to the dynamics of epitaxial grown, the epitaxially-grown source regions 50 and drain regions 51 are further disposed overlying a top of the first sidewall spacer 36 and a top of the second sidewall spacer 38 when present. However, due to the smaller profile of the second sidewall spacer 38 as compared to the first sidewall spacer 36, lateral epitaxial growth on the side of the first sidewall spacer 36 is restricted as compared to lateral epitaxial growth on the side of the second sidewall spacer 38, thus resulting in an asymmetric profile of the epitaxially-grown along a lateral direction 52 perpendicular to a length of the fins 12. In particular, the epitaxially-grown source regions 50 and drain regions 51 protrude less on the first side 28 of the fins 12 (indicated by distance 54) than on the second side 32 of the fins 12 (indicated by distance 56) along the lateral direction 52 that is perpendicular to the length of the fins 12. The asymmetric profile of the epitaxially-grown source regions 50 and drain regions 51 enables the epitaxially-grown source regions 50 and drain regions 51 from adjacent fin field-effect transistors on adjacent fins 12 to be isolated from direct physical contact by effectively lengthening a distance 58 between the epitaxially-grown source regions 50 and drain regions 51 of the adjacent fin field-effect transistors, as compared to distances between epitaxially-grown source regions and drain regions that are formed with a symmetric profile, while maximizing available surface area of the epitaxially-grown source regions 50 and drain regions 51 for formation of silicide.

FIG. 7 illustrates an exemplary FinFET device 60 including the gate electrode structure 20, fins 12, and epitaxially-grown source regions 50 and drain regions 51. In embodiments, the gate electrode structure 20 is a dummy gate electrode structure, which may be replaced with a replacement gate structure after epitaxially growing the semiconductor material in the trenches 48 to form the epitaxially-grown source regions 50 and drain regions 51. In other embodiments, a gate-first approach is employed with the original gate electrode structure 20 remaining in place after epitaxially growing the semiconductor material in the trenches 48 to form the epitaxially-grown source regions 50 and drain regions 51. After optional replacement of the gate electrode structure 20, although not shown silicide may be formed on surfaces of the epitaxially-grown source regions 50 and drain regions 51 through conventional techniques, followed by back-end-of-line (BEOL) fabrication techniques to connect transistors in the resulting FinFET device 60. The resulting FinFET device 60 has a single fin transistor configuration due to the electrical isolation of the epitaxially-grown source regions 50 and drain regions 51 on adjacent fins 12. The single fin transistor configuration may include the gate electrode structure 20 that extends across multiple fins 12.

Figure 8:
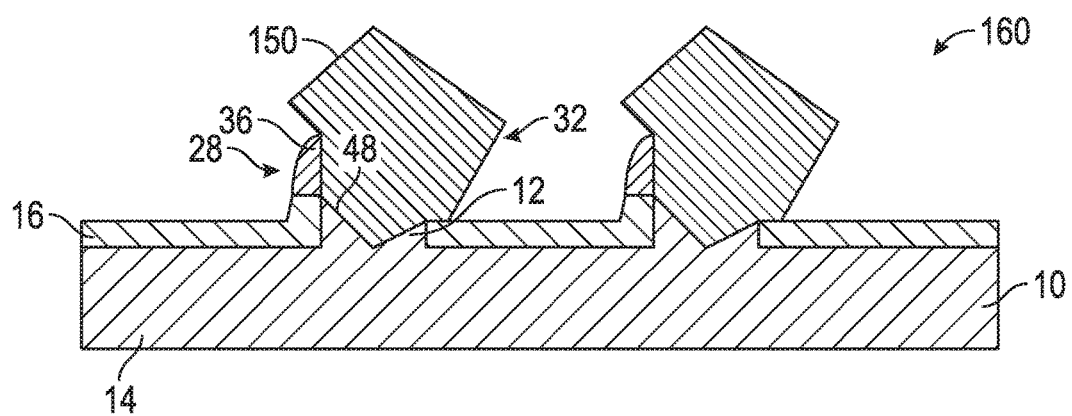
FIG. 8 is a cross-sectional side view of another exemplary embodiment of a FinFET device.

As alluded to above, in embodiments, the second sidewall spacer is optional and may be completely removed. In particular, during asymmetrically etching of the second intermediate sidewall spacer as compared to the first intermediate sidewall spacer, the second intermediate sidewall spacer may be removed such that the second sidewall spacer is absent after asymmetric etching. Referring to FIG. 8, the resulting FinFET device 160 is free from a second sidewall spacer disposed adjacent to the second side 32 of the fins 12. More specifically, no spacers are disposed adjacent to the second side 32 of the fins 12. In this embodiment, the epitaxially-grown source regions 150 and drains regions are disposed overlying the first sidewall spacer 36 on the first side 28 of the fins 12 and are further disposed directly on the first insulator layer 16 adjacent to the second side 32 of the fins 12.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration in any way. Rather, the foregoing detailed description will provide those skilled in the art with a convenient road map for implementing an exemplary embodiment. It being understood that various changes may be made in the function and arrangement of elements described in an exemplary embodiment without departing from the scope as set forth in the appended claims.

What is claimed is:

1. A fin field-effect transistor device comprising:
a semiconductor substrate having a plurality of fins disposed in parallel relationship;
a first insulator layer overlying the semiconductor substrate, with the fins extending through and protruding beyond the first insulator layer to provide exposed fin portions;
a gate electrode structure overlying the exposed fin portions and electrically insulated from the fins by a gate insulating layer; and
a first sidewall spacer is disposed adjacent to a first side of the fins and directly over the first insulator layer; and
epitaxially-grown source regions and drain regions disposed adjacent to the gate electrode structure;
wherein the epitaxially-grown source regions and drain regions have an asymmetric profile along a lateral direction perpendicular to a length of the fins, wherein portions of the epitaxially-grown source regions and drain regions are further disposed overlying a top of the first sidewall spacer and wherein epitaxially-grown source regions and drain regions from adjacent fin field-effect transistors on adjacent fins are isolated from direct physical contact.

2. The fin field-effect transistor device of claim 1, wherein the epitaxially-grown source regions and drain regions protrude less on a first side of the fins than on a second side of the fins along the lateral direction perpendicular to the length of the fins.

3. The fin field-effect transistor device of claim 2, free from a second sidewall spacer disposed adjacent to the second side of the fins.

4. The fin field-effect transistor device of claim 3, wherein the epitaxially-grown source regions and drain regions are further disposed overlying the first sidewall spacer on the first side of the fins and directly on the first insulator layer adjacent to the second side of the fins.

5. The fin field-effect transistor device of claim 1, wherein a second sidewall spacer is disposed adjacent to a second side of the fins and over the first insulator layer, and wherein the second sidewall spacer is smaller than the first sidewall spacer.

6. The fin field-effect transistor device of claim 5, wherein portions of the epitaxially-grown source regions and drain regions are further disposed overlying a top of the second sidewall spacer.

7. The fin field-effect transistor device of claim 1, wherein a second sidewall spacer is disposed adjacent to the second side of the fins and over the first insulator layer, wherein the second sidewall spacer is smaller than the first sidewall spacer, and wherein the epitaxially-grown source regions and drain regions protrude less on the first side of the fins than on a second side of the fins along the lateral direction perpendicular to the length of the fins.

8. The fin field-effect transistor device of claim 1, wherein the fins are recessed at locations of the epitaxially-grown source regions and drain regions and wherein the epitaxially-grown source regions and drain regions are grown only from the recessed portions of the fins.

9. The fin field-effect transistor device of claim 1, wherein the fin field-effect transistor device has a single fin transistor configuration.

10. The fin field-effect transistor device of claim 1, wherein the device is free from a second sidewall spacer disposed adjacent to a second side of the fins, and wherein the epitaxially-grown source regions and drain regions protrude less on the first side of the fins than on a second side of the fins along the lateral direction perpendicular to the length of the fins.

* * * * *